United States Patent
Lin et al.

(10) Patent No.: US 8,940,606 B2
(45) Date of Patent: Jan. 27, 2015

(54) METHOD FOR FABRICATING TRENCH TYPE POWER TRANSISTOR DEVICE

(75) Inventors: Yung-Fa Lin, Hsinchu (TW); Shou-Yi Hsu, Hsinchu County (TW); Meng-Wei Wu, Hsinchu (TW); Main-Gwo Chen, Hsinchu County (TW); Chia-Hao Chang, Hsinchu (TW); Chia-Wei Chen, Taipei (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 234 days.

(21) Appl. No.: 13/543,877

(22) Filed: Jul. 8, 2012

(65) Prior Publication Data
US 2013/0119460 A1    May 16, 2013

(30) Foreign Application Priority Data
Nov. 15, 2011   (TW) .............................. 100141614 A

(51) Int. Cl.
| | |
|---|---|
| H01L 29/78 | (2006.01) |
| H01L 29/06 | (2006.01) |
| H01L 29/66 | (2006.01) |
| H01L 29/739 | (2006.01) |
| H01L 29/423 | (2006.01) |
| H01L 21/225 | (2006.01) |
| H01L 29/417 | (2006.01) |
| H01L 29/10 | (2006.01) |

(52) U.S. Cl.
CPC ...... *H01L 29/0634* (2013.01); *H01L 29/66348* (2013.01); *H01L 29/7397* (2013.01); *H01L 29/423* (2013.01); *H01L 29/66727* (2013.01); *H01L 29/66734* (2013.01); *H01L 29/7811* (2013.01); *H01L 29/7813* (2013.01); *H01L 29/7395* (2013.01); *H01L 21/2255* (2013.01); *H01L 29/41766* (2013.01); *H01L 29/1095* (2013.01)
USPC .................. 438/270; 257/330; 257/E29.262; 257/E21.41

(58) Field of Classification Search
CPC ............................. H01L 21/336; H01L 29/78
USPC ............. 257/330, E29.262, E21.41; 438/270
See application file for complete search history.

(56) References Cited

U.S. PATENT DOCUMENTS

| | | | |
|---|---|---|---|
| 2005/0059214 A1* | 3/2005 | Cheng et al. .................. | 438/270 |
| 2008/0311715 A1* | 12/2008 | Hu et al. ....................... | 438/278 |
| 2009/0020810 A1* | 1/2009 | Marchant ...................... | 257/331 |
| 2009/0140327 A1* | 6/2009 | Hirao et al. ................... | 257/328 |
| 2011/0049614 A1 | 3/2011 | Gao | |
| 2011/0053326 A1* | 3/2011 | Gao et al. ..................... | 438/270 |

* cited by examiner

*Primary Examiner* — Kevin Parendo
*Assistant Examiner* — Lamont Koo
(74) *Attorney, Agent, or Firm* — Winston Hsu; Scott Margo

(57) ABSTRACT

The present invention provides a trench type power transistor device including a substrate, an epitaxial layer, a doped diffusion region, a doped source region, and a gate structure. The substrate, the doped diffusion region, and the doped source region have a first conductivity type, and the substrate has an active region and a termination region. The epitaxial layer is disposed on the substrate, and has a second conductivity type. The epitaxial layer has a through hole disposed in the active region. The doped diffusion region is disposed in the epitaxial layer at a side of the through hole, and is in contact with the substrate. The doped source region is disposed in the epitaxial layer disposed right on the doped diffusion region, and the gate structure is disposed in the through hole between the doped diffusion region and the doped source region.

6 Claims, 9 Drawing Sheets

METHOD FOR FABRICATING TRENCH TYPE POWER TRANSISTOR DEVICE

BACKGROUND OF THE INVENTION

1. Field of the Invention

The present invention generally relates to the field of semiconductor power devices. More particularly, the present invention relates to a trench type power transistor device having super-junction structures and a method thereof.

2. Description of the Prior Art

Power devices are used in power management; for example, in switchable power supplies, management integrated circuits in the core or in the peripheral region of computers, backlight power supplies, and in electric motor controls. The type of power devices described above include an insulated gate bipolar transistor (IGBT), a metal-oxide-semiconductor field effect transistor (MOSFET), a bipolar junction transistor (BJT) and so forth.

Please refer to FIG. 1, which is a schematic, cross-sectional diagram showing a structure of a conventional trench type power transistor device. As shown in FIG. 1, the conventional trench type power transistor device 10 includes an N-type substrate 12, an N-type epitaxial layer 14, a plurality of trenches 16, a gate isolation layer 18, a plurality of gates 20 and a source metal layer 22. The N-type epitaxial layer 14 is disposed on the N-type substrate 12 and each trench 16 is located on the N-type epitaxial layer 14. The gate isolating layer 18 covers the surface of each trench 16 and each gate 20 is filled into each trench 16. The function of the gate isolating layer 18 is to electrically isolate each gate 20 from the source metal layer 22. A plurality of P-type doped base regions 24 is formed on the N-type epitaxial layer 14. An N-type doped source region 26 is formed on each P-type doped base region 24 where a P-type doped contact region 28 can be implanted. Each P-type doped contact region 28 is electrically connected to the source metal layer 22 through a metal contact 30. Furthermore, a drain metal layer 32 is disposed on the bottom of the N-type substrate 12 in the conventional trench type power transistor device 10.

In order to enhance the voltage sustaining ability of trench type power transistor devices, in some cases, N-type and P-type epitaxial layers are alternately disposed so that several parallel PN junctions are formed on the N-type substrate. Power transistor devices having above-mentioned parallel PN junctions are also called super-junction power transistor devices. However, since an overlapped area between a gate structure and an N-type epitaxial layer (also called drain region) in this power transistor device is relatively high, and the thickness of a gate dielectric layer between the gate structure and the N-type epitaxial layer is relatively thin, these will cause relatively high Miller capacitance and produce inevitable switching losses. As a result, the performance of the devices is lowered.

In light of the above, there is still a need to invent an improved power transistor device which is capable of overcoming the shortcomings and deficiencies of the prior art.

SUMMARY OF THE INVENTION

It is therefore one objective of the invention to provide a trench type power transistor device and a method thereof so that a power transistor device with low Miller capacitance and high voltage sustaining ability can be obtained.

To this end, the invention provide a trench type power transistor device including a substrate, an epitaxial layer, a first doped diffusion region, a doped source region, a gate structure, a second doped diffusion region, and a terminal conductive layer. The substrate has a first conductivity type, and the substrate has an active region and a termination region. The epitaxial layer is disposed on the substrate, and has a second conductivity type. The epitaxial layer has at least a first through hole and at least a second through hole respectively penetrating the epitaxial layer, wherein the first through hole is located in the active region, and the second through hole is located in the termination region. The first doped diffusion region is disposed in the epitaxial layer at one side of the first through hole and in direct contact with the substrate, wherein the first doped diffusion region has the first conductivity type. The doped source region is disposed in the epitaxial layer right above the first doped diffusion region, wherein the doped source region has the first conductivity type. The gate structure is disposed in the first through hole between the first doped diffusion region and the doped source region. The second doped diffusion region is disposed on one side of the second through hole in the epitaxial layer and in directly contact with the substrate, wherein the second doped diffusion region has the first conductivity type. And the terminal conductive layer is disposed in the second through hole right above the second doped diffusion region.

According to another aspect, the present invention provides a method for fabricating a trench type power transistor device, which includes the following steps. First, a substrate having a first conductivity type is provided, wherein the substrate has an active region and a termination region. Then, an epitaxial layer is formed on the substrate, wherein the substrate has a second conductivity type different from the first conductivity type. At least a first through hole and at least a second through hole respectively penetrating the epitaxial layer are formed in the epitaxial layer, wherein the first through hole is located in the active region and the second through hole is located in the termination region. After the formation of the through holes, a dopant source layer is filled into the first through hole and the second through hole respectively. A first doped diffusion region is formed at one side of the first through hole in the epitaxial layer and a second doped diffusion region is formed in the epitaxial layer at one side of the second through hole, wherein the first doped diffusion region and the second doped diffusion region have the first conductivity type. Then, a gate structure is formed in the first through hole. Finally, a doped source region is formed at one side of the first through hole in the epitaxial layer which is right above the first doped diffusion region. The doped source region has the first conductivity type and the gate structure is disposed between the first doped diffusion region and the doped source region.

The present invention provides a method for fabricating a trench type power transistor device, which has first doped diffusion layers partially overlapped by the gate conductive layer along a vertical direction. The first doped diffusion layers can be fabricated by first filling a first through hole with electrically insulating dopant source layer and then performing a thermal drive-in process so that conductive dopants inside the dopant source layer can diffuse into an epitaxial layer. As a result, the first doped diffusion layers with the first conductivity type and the epitaxial layer with the second conductivity type are alternately arranged and can construct a super junction structure. In addition, since the dopant source layer having insulating properties is located under the gate conductive layer, a parasitical capacitor between the gate and the drain of the trench type power transistor device can be reduced, and the Miller capacitance and switching losses in the device can be reduced effectively. As a result, the performance of the device is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
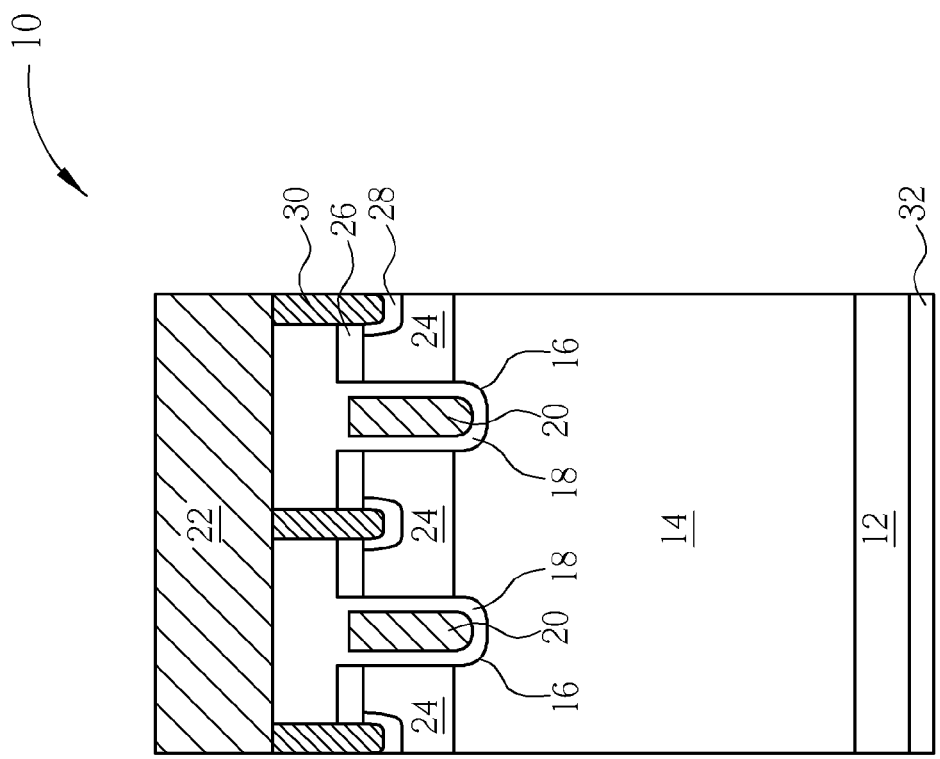
FIG. 1 is a schematic, cross-sectional diagram showing a structure of a conventional trench type power transistor device.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Figure 2:
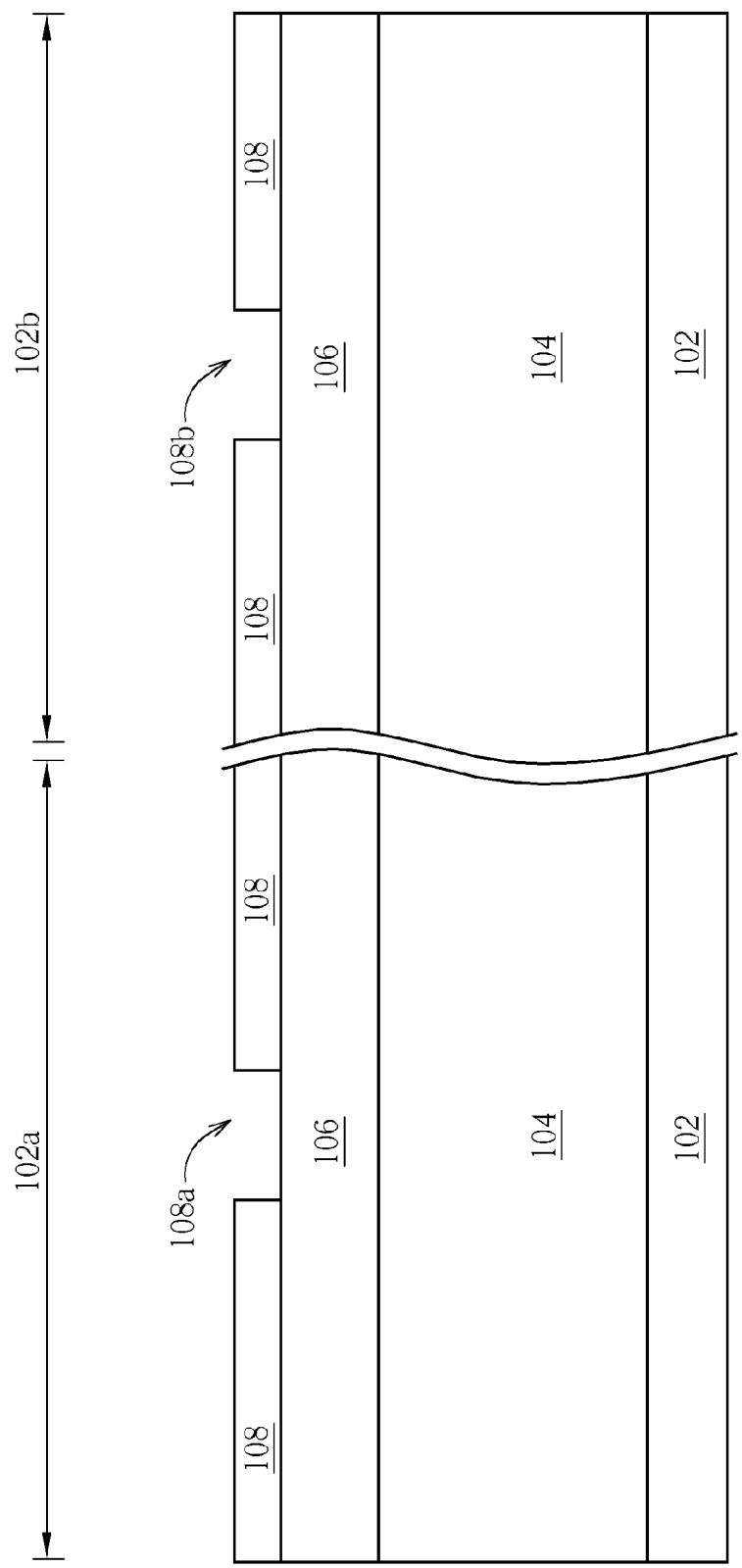
FIGS. 2-9 are schematic, cross-sectional diagrams showing a method for fabricating a trench type power transistor device according to one embodiment of the invention.
Figure 7:
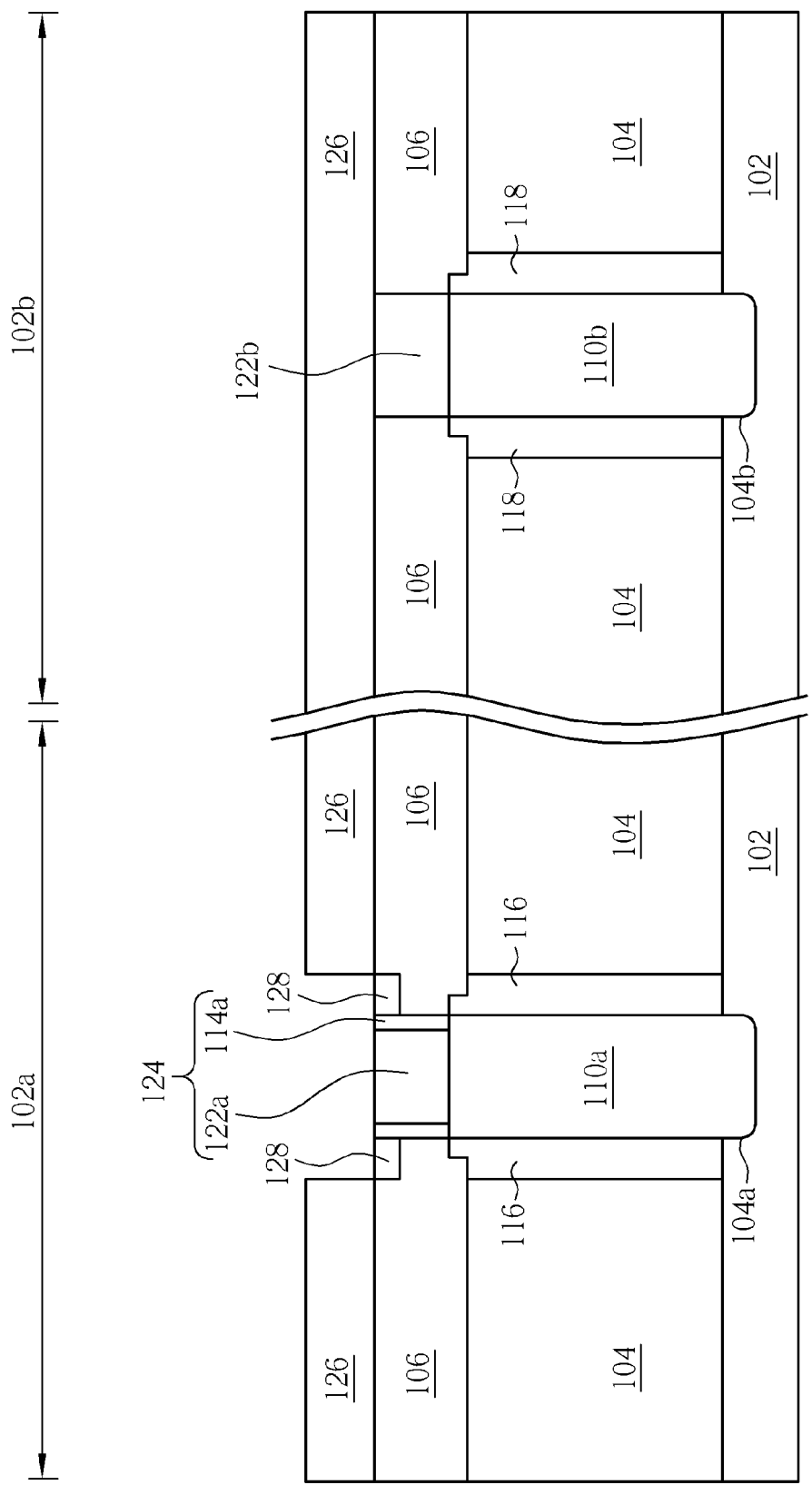
Figure 8:
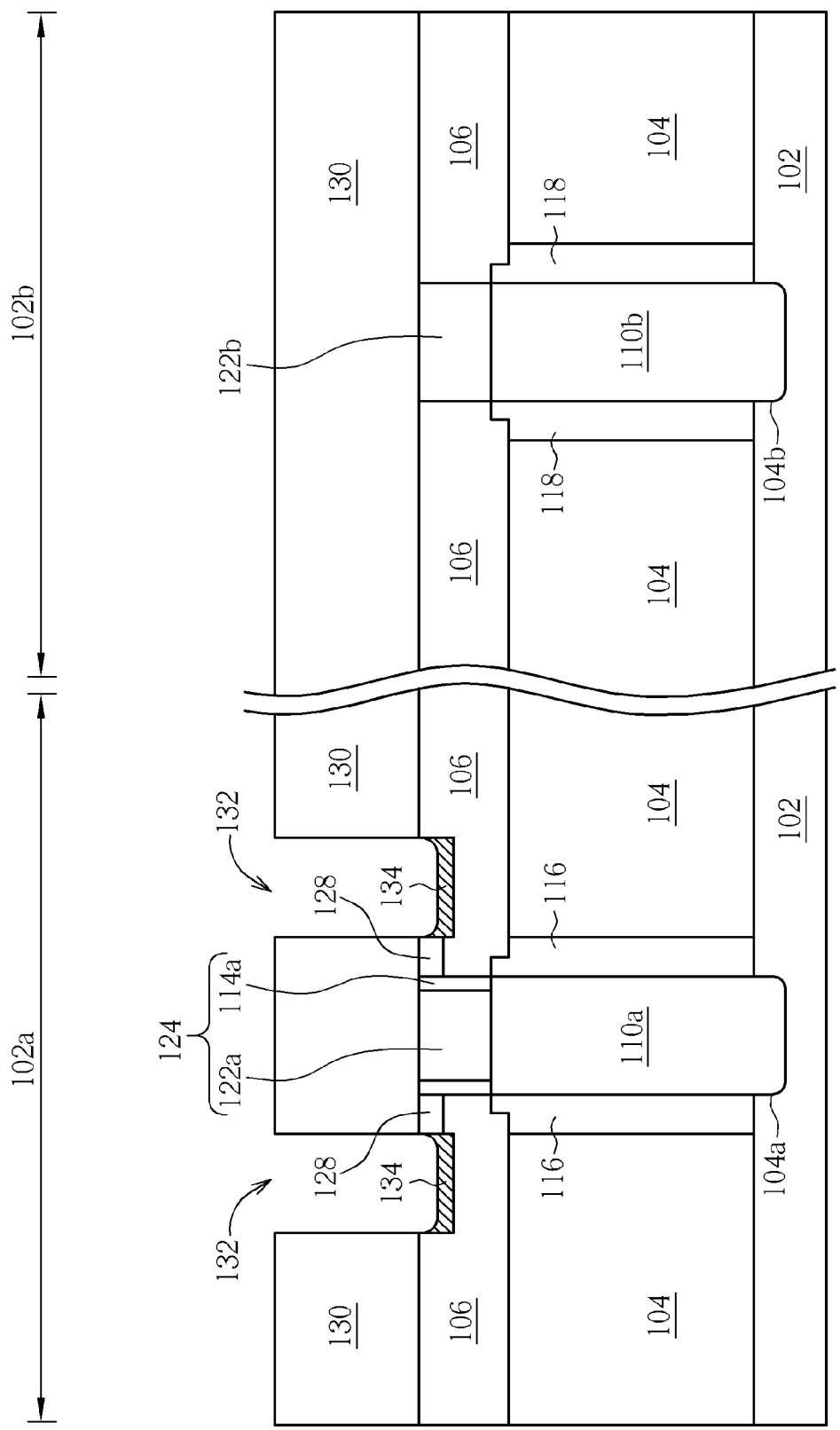
Figure 9:
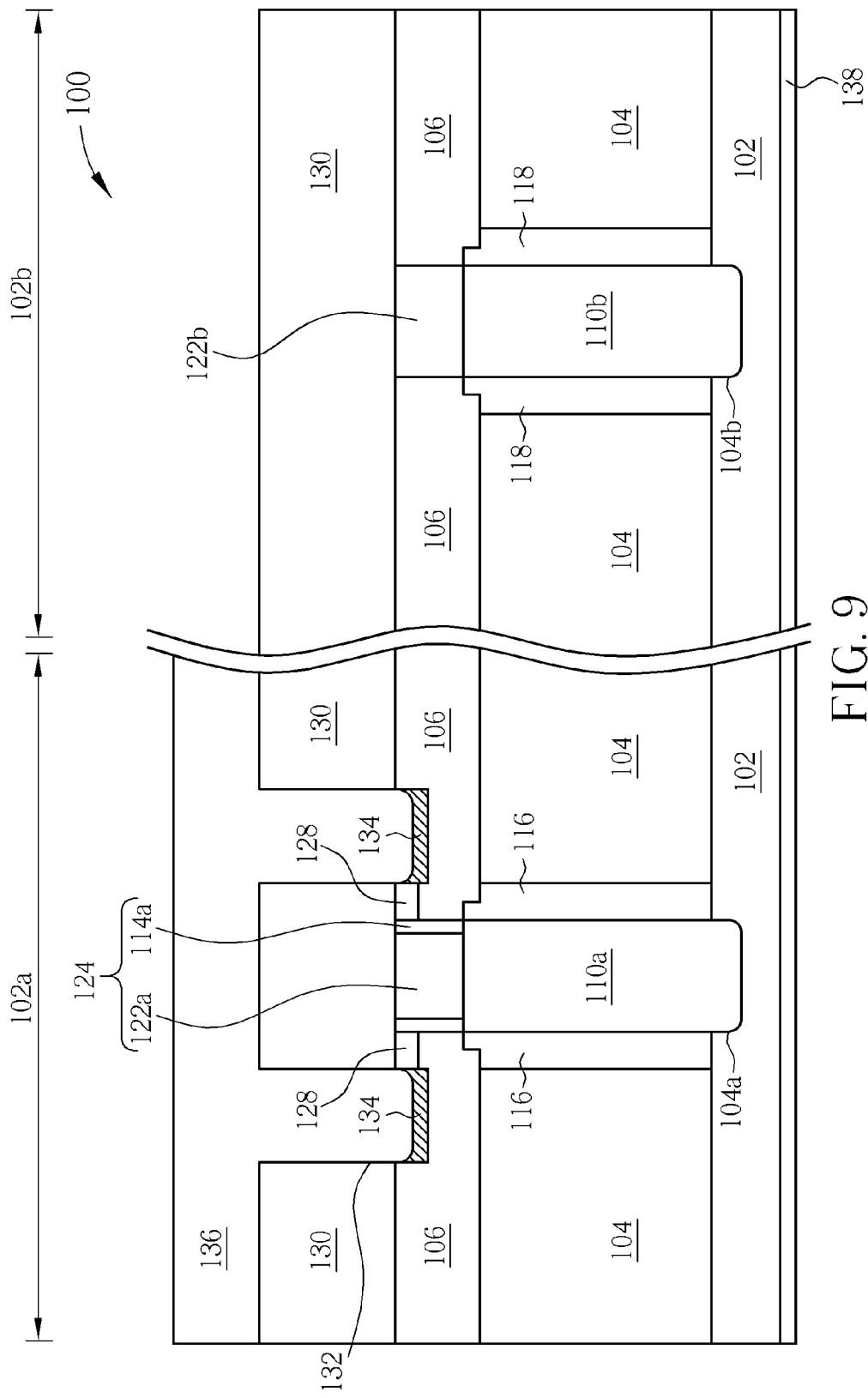

Please refer to FIG. 2 to FIG. 9. FIGS. 2-9 are schematic, cross-sectional diagrams showing a method for fabricating a trench type power transistor device according to one embodiment of the invention, wherein FIG. 9 is a schematic, cross-sectional diagram showing a structure of the trench type power transistor device. As shown in FIG. 2, a substrate 102 having a first conductivity type and having an active region 102a and a termination region 102b is provided, wherein the active region 102a is used to accommodate active devices and the termination region 102b is used to accommodate a termination structure. Then, an epitaxial layer 104 having a second conductivity type is formed on the substrate 104 through performing an epitaxial growth process, wherein the second conductivity type is different from the first conductivity type. After the formation of the epitaxial layer 104, an oxide layer (not shown) is then formed on the epitaxial layer 104 through a deposition process. With the existence of the oxide layer (not shown), an ion implantation process and a thermal drive in process may be carried out sequentially so that dopants with the second conductivity type can be implanted into the epitaxial layer 104 and, as a consequence, a well 106 with the second conductivity type is formed. The oxide layer is then removed and a hard mask layer 108 is formed on the epitaxial layer 104, such as silicon nitride ($Si_3N_4$) or silicon oxide ($SiO_2$), but is not limited thereto. Preferably, the hard mask layer 108 has at least a first opening 108a and at least a second opening 108b, wherein the first opening 108a is within the active region 102a and the second opening 108b is within the termination region 102b. In all embodiments of the present invention, the first conductivity type is defined as P-type and the second conductivity type is defined as N-type, but is not limited thereto. For example, the first and second conductivity type may also be regarded as N-type and P-type, respectively. Additionally, the P-type substrate 102 may be selected from silicon substrate or silicon wafer, which can serve as a drain in the trench type power transistor device. Furthermore, the N-type well 106 is used to adjust the concentration of a channel region in the trench type power transistor device so that the threshold voltage ($V_{th}$) of the trench type power transistor device can be modified. It is worth noting that the N-type well 106 is not a necessary element in the present invention. That is to say, the formation of the oxide layer and the N-type well can be omitted, if required. Additionally, the quantity of each first opening 108a and each second opening 108b is not limited to only one, but could be more than one.

Figure 3:
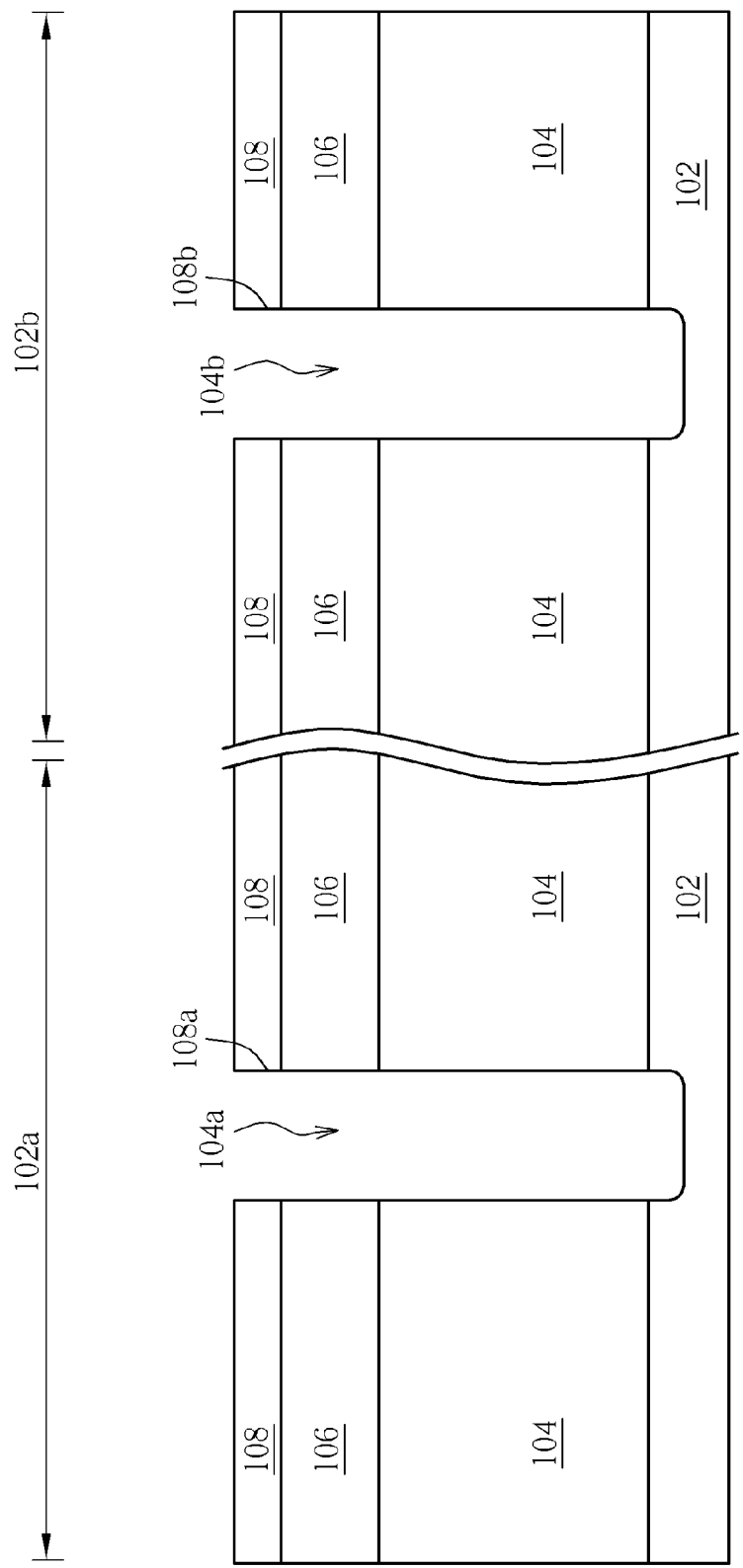

Please refer to FIG. 3. An etching process is carried out by using the hard mask layer 108 as a mask layer so that the N-type epitaxial layer 104 exposed from the first opening 108a and the second opening 108b is removed completely. In this way, at least a first through hole 104a and at least a second through hole 104b respectively penetrating the N-type epitaxial layer 104 are formed in the N-type epitaxial layer 104. The location of the first through hole 104a corresponds to that of the first opening 108a within the active region 102a; while the second through hole 104b corresponds to that of the second opening 108b within the termination region 102b. As mentioned above, since the locations of the first through hole 104a and the second through hole 104b correspond to those of the first opening 108a and the second opening 108b, and the quantity of each first opening 108a and each second opening 108b may be one or more than one, the quantity of each kind of through holes 108a, 108b may also be one or more than one. In addition, in this embodiment, the bottom of the first through hole 104a and the second through hole 104b extends to the P-type substrate 102.

Figure 4:
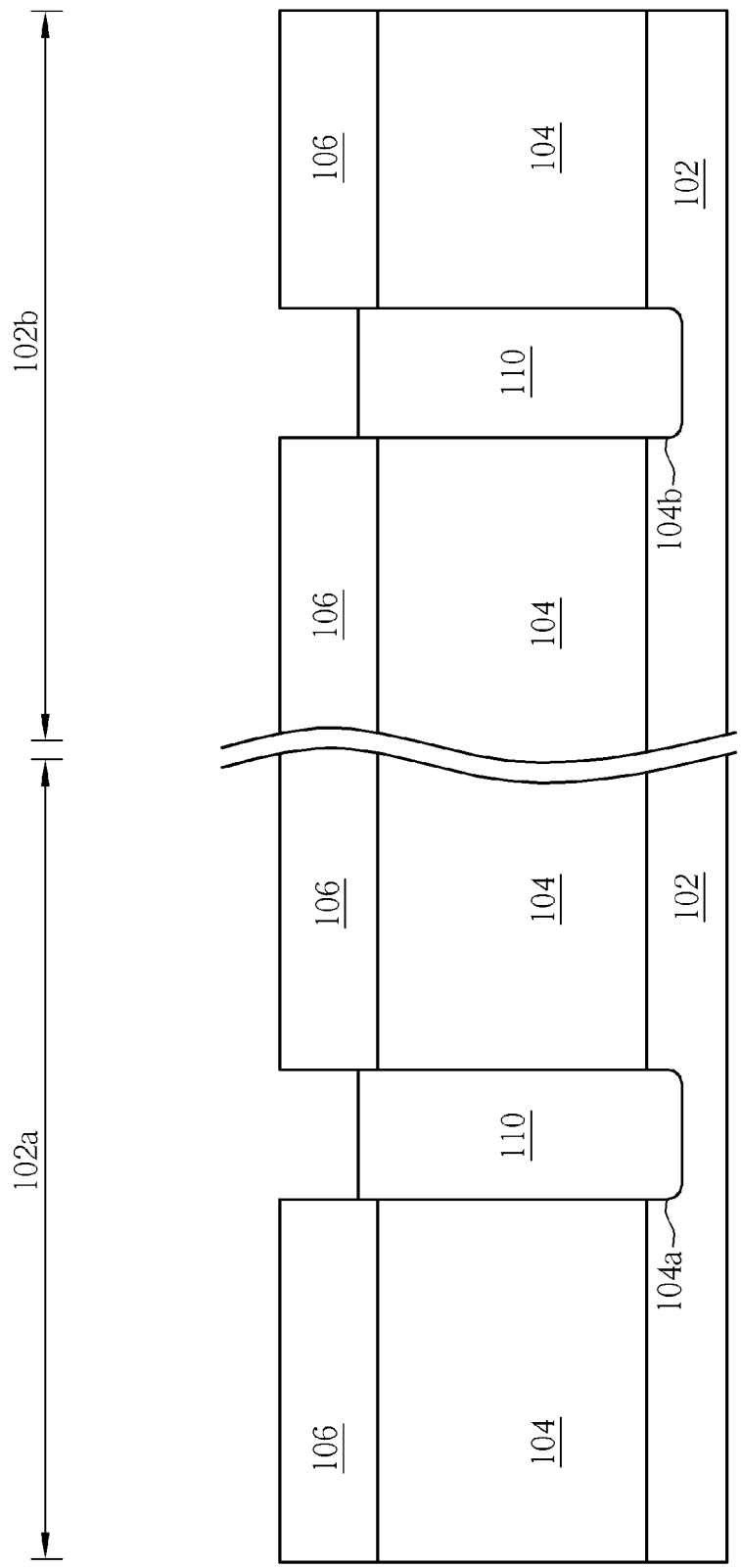

As depicted in FIG. 4, after the hard mask layer 108 is removed, a dopant source layer 110 including a plurality of P-type dopants is filled into the respective first through hole 104a and second through hole 104b. Chemical mechanical polishing (CMP) processes and etching back processes can then be performed in order to remove all of the dopant source layer 110 above the surface of the N-type epitaxial layer 104 and to remove portions of the dopant source layer 110 within the first through hole 104a and the second through hole 104b. After that, the upper surface of the dopant source layer 110 will be higher than the bottom of the N-type well 106. In this embodiment, the composition of the dopant source layer 110 may include boron silicate glass (BSG), but is not limited thereto. It should be noted that, the upper surface of the dopant source layer 110 is not restricted to be higher than the bottom of the N-type well 106, it could be aligned with or slightly lower than the level of the bottom of the N-type well 106. Also, in other embodiments of the present invention, a buffer layer (not shown) may be formed on the inner surface of the first and second through hole, if required. For example, thermal oxidation processes or other suitable processes are performed in order to form the buffer layer, such as silicon oxide. Additionally, after the step of filling up the through holes with the dopant source layer, an N-type ion implantation process may be optionally performed to adjust the concentration of the N-type well adjacent to the both side of the first through hole. As a result, the threshold voltage ($V_{th}$) of the trench type power transistor device can be well-controlled.

Figure 5:
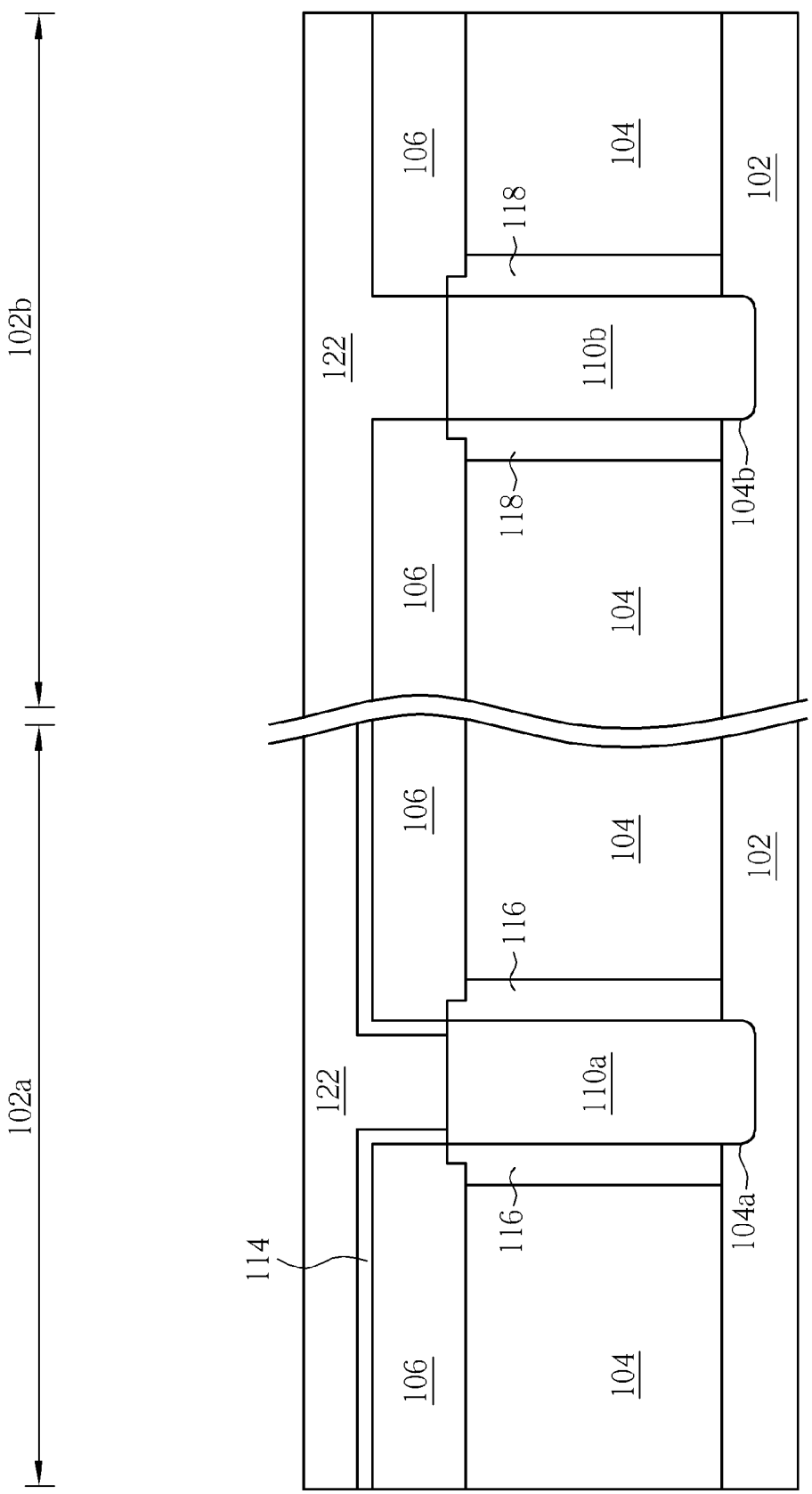

Referring to FIG. 5, a third isolation layer 114 is formed conformally on the surface of the N-type epitaxial layer 104 and on the inner surface of the first through hole 104a and the second through hole 104b. When the third isolation layer 114 is formed, P-type dopants inside the dopant source layer 110 can diffuse into the N-type epitaxial layer 104 concurrently. Therefore, a P-type first doped diffusion region 116 is formed on two sides of each first through hole 104a in the N-type epitaxial layer 104; and a P-type second doped diffusion region 118 is formed on two sides of each second through hole 104b in the N-type epitaxial layer 104. These alternately arranged P-type doped diffusion regions 116 and 118 and the N-type epitaxial layer 104 can form several PN-junctions approximately vertical to the N-type substrate 102, which can form a super junction structure. Furthermore, the dopant source layer 110 inside the first through hole 104a can act as a first isolation layer 110a and the dopant source layer 110 inside the second through hole 104b can act as a second isolation layer 110b. A photolithography process and an etching process are then carried out to remove the third isolation layer 114 inside the termination region 102b. A deposition process is then carried out to form a conductive layer 122 located above the N-type epitaxial layer 106 and the second isolation layer 110b within the termination region 102b; and located on the first isolation layer 110a and the third isolation layer 114 within the active region 102a. Additionally, the conductive layer 122 is also filled into the first through hole 104a and the second through hole 104b. In this embodiment, each P-type first doped diffusion region 116 is electrically connected to the P-type substrate 102 and can serve as a drain in the trench type power transistor device. The third isolation layer 114 including silicon oxide may be formed through a thermal oxidation process, but is not limited thereto. In addition, the timing for forming the third isolation layer 114 may differ from that of forming the P-type first and second doped diffusion regions. In other embodiments of the invention, the third isolation layer 114 is formed through deposition processes accompanied with photolithography and etching processes. The composition of the third isolation layer 114 is not restricted to silicon oxide, it may be replaced with other suitable electrically insulating materials. Furthermore, the step for forming the P-type first diffusion region 116 and the second doped diffusion region 118 includes a thermal drive-in process which can diffuse P-type dopants into the N-type epitaxial layer 104. The conductive layer 122 may comprise polysilicon or other suitable conductive materials.

Figure 6:
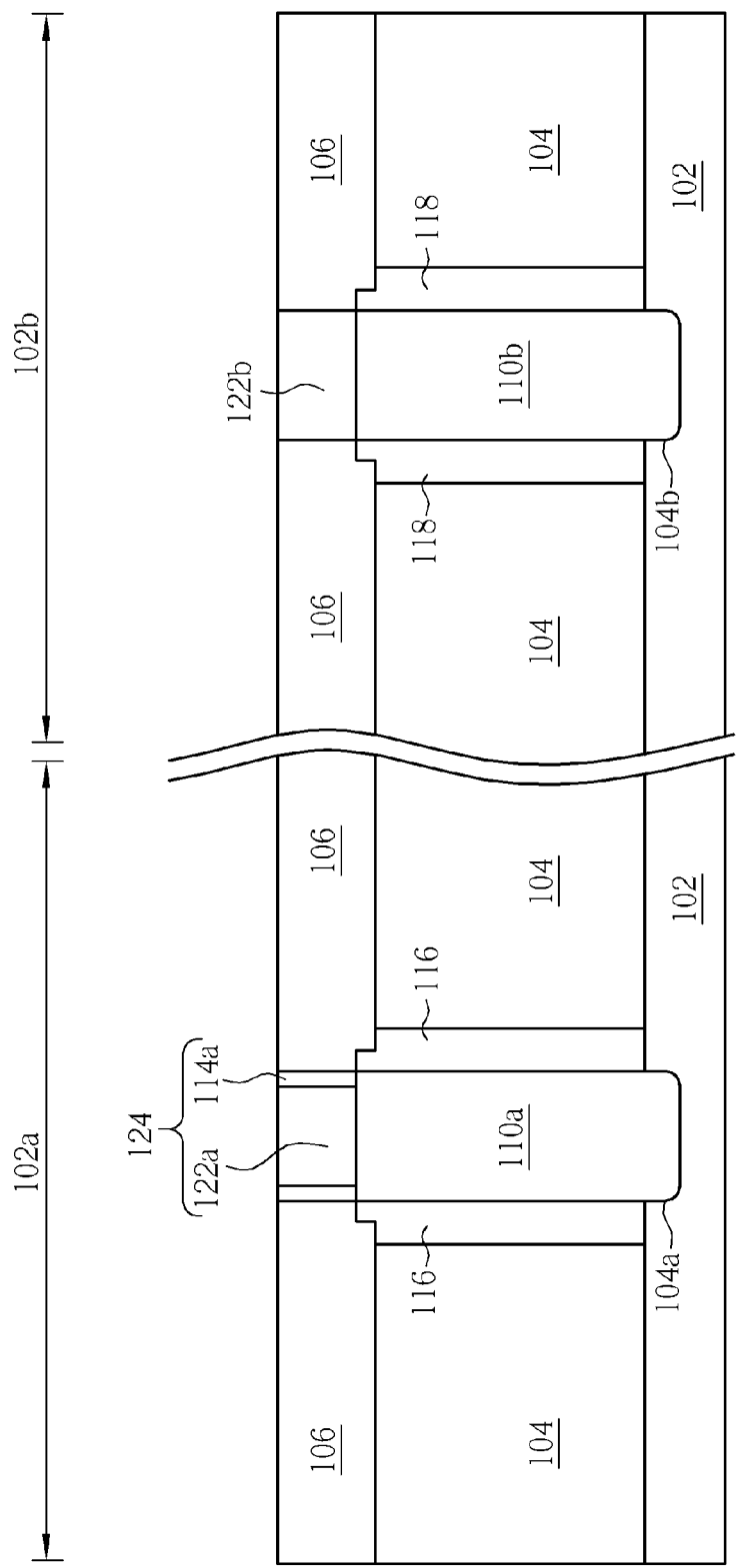

A chemical mechanical polishing (CMP) process or an etching back process is performed, as shown in FIG. 6, to remove both the third isolation layer 114 and the conductive layer 122 outside the first through hole 104a and the second through hole 104b. After the above steps, a gate structure 124 is formed inside the first through hole 104a and includes a gate dielectric layer 114a and a gate conductive layer 122a. The gate dielectric layer 114a is located between the gate conductive layer 122a and the N-type well 106. In this embodiment, the gate conductive layer 122a inside the first through hole 104a is electrically isolated from the P-type first doped diffusion region 116 and the N-type epitaxial layer 104 by the gate dielectric layer 114a and the first isolation layer 110a. Hence, the gate conductive layer 122a can be used as a gate in the trench type power transistor device. It should be noted that the first isolation layer 110a under the gate conductive layer 122a can extend from the gate conductive layer 122a to the P-type substrate 102 so that a parasitic capacitance induced between the gate and the drain in the trench type power transistor device can be reduced. As a consequence, the performance of the device is improved due to the reduction of Miller capacitance and switching losses. Further, the terminal conductive layer 122b, the second doped diffusion region 118 and the N-type epitaxial layer 104 can comprise a termination structure. The terminal conductive layer 122b can function as a coupling conductive layer to avoid the occurrence of an abrupt voltage drop within the termination region 102b and further terminates the voltage in a certain area.

Please refer to FIG. 7. A patterned photoresist 126 is formed on the N-type epitaxial layer 104 to expose portions of the N-type epitaxial layer 104 on both sides of the first through hole 104a and all gate structures 124. A P-type ion implantation process is carried out to form an P-type source doped region 128 in the N-type epitaxial layer 104 on both sides of the first through hole 104a, wherein each P-type source doped region 128 is located in the N-type epitaxial layer 104 right above each P-type first doped diffusion region 116 and can serve as a source in the device. Additionally, the gate structure 124 is disposed in the corresponding first through hole 104a between the P-type first doped diffusion region 116 and the corresponding P-type doped source region 128. A channel region (not shown) vertical to the P-type substrate 102 is in the N-type well 106 along the gate dielectric layer 114a, which is between the P-type first doped diffusion region 116 and the corresponding P-type doped source region 128. Therefore, based on the description in the above paragraphs, the power device described in this embodiment belongs to a vertical type power transistor device.

As shown in FIG. 8, after the removal of the patterned photoresist 126, a dielectric layer 130 is formed to cover all surfaces of the N-type epitaxial layer 104 and those of the gate structure 124. At least two contact openings 132 are then defined in the dielectric layer 130 within the active region 102a through performing a photolithography and an etching process. Each of the contact openings 132 can expose portions of N-type epitaxial layer 104 and portions of each P-type doped source region 128. An N-type ion implantation process is carried out to form an N-type doped contact region 134 in the N-type epitaxial layer 104 exposed from each contact opening 132. The N-type doped contact region 134 can directly contact with each P-type doped source region 128. In order to activate the N-type dopants in the N-type doped contact region 134, an anneal process is then performed. The purpose of the N-type doped contact region 134 is to improve the conductivity at the interface between metal and semiconductor.

As shown in FIG. 9, a metal layer (not shown) is formed on the dielectric layer 130 and inside each of the contact openings 132. A photolithography process and an etching process are then performed to remove the metal layer within the termination region 102b, thereby forming at least a source conductive layer 136 within the active region 102a. A drain conductive layer 138 can be formed on the bottom of the P-type substrate 102. In this embodiment, steps for forming the source conductive layer 136 may include sputter deposition, electron beam deposition process and so forth, and the composition of the source conductive layer 136 may be selected from the group consisting of titanium, titanium nitride, aluminum, tungsten, or other metal or metal composite, but is not limited thereto. As a result, the trench type power transistor device 100 is formed. According to other embodiments of the present invention, prior to the formation of the source conductive layer, a contact plug may be formed in each contact opening or a barrier layer (not shown) may be formed in the N-type epitaxial layer at the bottom of the contact hole. The barrier includes titanium, titanium nitride, aluminum, tungsten, or other metal or metal composite, but is not limited thereto, which can prevent metal atoms inside the contact holes from electro-migrating or diffusing into the N-type epitaxial layer. It is worth noting that, since the trench type power transistor device 100 described in the present invention is a P-type power transistor device, it has a relatively high forward biased safe operation area (SOA) and the characteristics of anti-single event burn out (SEBO) compared to conventional N-type power transistor devices. The P-type trench type power transistor device 100 with a super junction structure can also provide higher voltage sustaining ability and reduced turn-on resistance ($R_{dson}$).

To summarize, the present invention provides a method for fabricating a power transistor device. The power transistor device has a super junction structure which can be fabricated by first filling a first through hole with an electrically insulating dopant source layer and then performing thermal drive-in processes so that conductive dopants inside the dopant source layer can diffuse into an epitaxial layer. The electrically insulating dopant source layer is located under gate conductive layer and can be regarded as a thick electrical insulation layer. Thanks to the existence of the dopant source layer, Miller capacitance and switching losses which occur in the device can be reduced effectively and, as a result, the performance of the device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a trench type power transistor device, comprising:

providing a substrate having a first conductivity type, wherein the substrate has an active region and a termination region;

forming an epitaxial layer on the substrate, wherein the substrate has a second conductivity type different from the first conductivity type;

forming at least a first through hole and at least a second through hole in the epitaxial layer to penetrate the epitaxial layer respectively, wherein the first through hole is located in the active region and the second through hole is located in the termination region;

filling a dopant source layer into the first through hole and the second through hole respectively, wherein each of the dopant source layers comprises a plurality of dopants having the first conductivity type;

diffusing the plurality of dopants into the epitaxial layer to form a first doped diffusion region in the epitaxial layer at one side of the first through hole, a second doped diffusion region in the epitaxial layer at one side of the second through hole, a first isolation layer in the first through hole and a second isolation layer in the second through hole, wherein the first doped diffusion region and the second doped diffusion region have the first conductivity type;

forming a gate structure in the first through hole; and forming a doped source region in the epitaxial layer at one side of the first through hole, and the doped source region located right above the first doped diffusion region, wherein the doped source region has the first conductivity type and the gate structure is disposed between the first doped diffusion region and the doped source region.

2. The method for fabricating the trench type power transistor device according to claim 1, wherein the step for forming the gate structure comprises:

forming a third isolation layer above the epitaxial layer and on sidewalls of both the first through hole and the second through hole;

removing the third isolation layer located within the termination region;

forming a conductive layer on the third isolation layer and on the epitaxial layer located in the termination region, wherein the conductive layer is filled into the first through hole and the second through hole; and removing both the third isolation layer and the conductive layer outside the first through hole and the second through hole so that the gate structure is formed in the first through hole and a terminal conductive layer is formed in the second through hole.

3. The method for fabricating the trench type power transistor device according to claim 2, wherein the third isolation layer, the first doped diffusion region and the second doped diffusion region are formed concurrently.

4. The method for fabricating the trench type power transistor device according to claim 1, wherein the dopant source layer comprises boron silicate glass (BSG).

5. The method for fabricating the trench type power transistor device according to claim 1, further comprising forming a well in the epitaxial layer between the step for forming the epitaxial layer and the step for forming the first through hole and the second through hole, wherein the well has the second conductivity type.

6. The method for fabricating the trench type power transistor device according to claim 1, wherein the first conductivity type is P-type and the second conductivity type is N-type.

* * * * *